(12) United States Patent
Thackeray et al.

(10) Patent No.: US 7,026,093 B2
(45) Date of Patent: Apr. 11, 2006

(54) PHOTORESIST COMPOSITIONS

(75) Inventors: James W. Thackeray, Braintree, MA (US); James F. Cameron, Cambridge, MA (US); Roger F. Sinta, Woburn, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 117 days.

(21) Appl. No.: 10/457,282

(22) Filed: Jun. 9, 2003

(65) Prior Publication Data
US 2003/0215748 A1 Nov. 20, 2003

Related U.S. Application Data

(63) Continuation-in-part of application No. 09/470,067, filed on Dec. 22, 1999, now Pat. No. 6,645,698, which is a continuation of application No. 08/921,985, filed on Aug. 28, 1997, now Pat. No. 6,037,107.

(51) Int. Cl.
*G03F 7/039* (2006.01)
(52) U.S. Cl. .................. 430/270.1; 430/921
(58) Field of Classification Search ............ 430/270.1; 522/59
See application file for complete search history.

(56) References Cited

U.S. PATENT DOCUMENTS

| | | |
|---|---|---|
| 4,491,628 A | 1/1985 | Ito et al. |
| 4,810,613 A | 3/1989 | Osuch et al. |
| 4,883,740 A | 11/1989 | Schwalm et al. |
| 4,968,581 A | 11/1990 | Wu et al. |
| 5,075,199 A | 12/1991 | Schwalm et al. |
| 5,258,257 A | 11/1993 | Sinta et al. |
| 5,350,660 A | 9/1994 | Urano et al. |
| 5,362,600 A | 11/1994 | Sinta et al. |
| 5,492,793 A | 2/1996 | Breyta et al. |
| 5,498,506 A | 3/1996 | Wengenroth et al. |
| 5,558,971 A | 9/1996 | Urano et al. |
| 5,558,976 A | 9/1996 | Urano et al. |
| 5,580,694 A | 12/1996 | Allen et al. |
| 5,593,812 A | 1/1997 | Babich et al. |
| 5,609,989 A | 3/1997 | Bantu et al. |
| 5,679,495 A | 10/1997 | Yamachika et al. |
| 5,753,412 A | 5/1998 | Babich et al. |
| 5,759,739 A | 6/1998 | Takemura et al. |
| 5,861,231 A | 1/1999 | Barclay et al. |
| 6,037,107 A * | 3/2000 | Thackeray et al. ......... 430/326 |

FOREIGN PATENT DOCUMENTS

| | | |
|---|---|---|
| EP | 0 596 668 A2 | 5/1994 |
| EP | 0 596 668 A3 | 5/1994 |
| EP | 0 631 188 A1 | 12/1994 |
| EP | 0 652 485 A1 | 5/1995 |
| EP | 0 631 188 B1 | 9/1997 |
| EP | 0 708 368 B1 | 6/1999 |
| EP | 938029 A2 * | 8/1999 |
| EP | 0 717 319 B1 | 4/2001 |
| JP | 07-209868 | 8/1995 |
| JP | 07-49569 A | 2/1997 |
| WO | WO 94/10608 | 5/1994 |

OTHER PUBLICATIONS

Chem. Abstract 123:354463 "Environmentally Stable Chemically Amplified Resist Effects of Organic Salt Additives", Fujitsu Laboratories, Ltd.
Wallraff et al., "Thermal and acid catalyzed deprotection kinetics in candidate deep ultraviolet resist materials", J. Vac. Sci. Technol., 12(6), pp. 3857-3862, 1994.
Wallraff et al., "Kinetics of Chemically Amplified Resists", Tenth International Technical Conference, Oct. 31-Nov. 2, 1994, Sponsored by Society of Plastics Engineers, Inc., pp. 11-17, 1994.
Yano et al., AN 123:354463, Abstract of Proc. SPIE-Int. Soc, Opt. Eng (1995), 2438, pp. 551-563, Chemical Abstracts, ACS, 1998.
Ishihara et al., Derwent-Acc-No.: 1995-126567, Derwent Information LTD, Copyright 1999, English Abstract of JP 07-049569A issued in Feb. 21, 1995, pp. 1-4.
Kobayashi et al., Derwent-Acc-No. 1995-314127, Derwent Information LTD, Copyright 1999, English abstract of JP-07-209868A issued Aug. 11, 1995, pp. 1-4.

* cited by examiner

*Primary Examiner*—Cynthia Hamilton
(74) *Attorney, Agent, or Firm*—John J. Piskorski

(57) ABSTRACT

Photoresist compositions having a resin binder with an acid labile blocking group with an activation energy in excess of 20 Kcal/mol. for deblocking, a photoacid generator capable of generating a halogenated sulfonic acid upon photolysis and optionally, a base.

3 Claims, No Drawings

PHOTORESIST COMPOSITIONS

The present application is a continuation-in-part of application Ser. No. 09/470,067, filed on Dec. 22, 1999, now U.S. Pat. No. 6,645,698, which is a continuation application of application Ser. No. 08/921,985, filed on Aug. 28, 1997, now U.S. Pat. No. 6,037,107.

BACKGROUND OF THE INVENTION

The present invention is directed to photoresist compositions suitable for DUV exposure. More particularly, the present invention is directed to a photoresist film where linewidth variation as a function of high temperature post exposure bake is minimized.

Photoresists are photosensitive films for transfer of an image to a substrate. These resists form negative or positive images. After coating a photoresist coating composition onto a substrate, the coating is exposed through a patterned photomask to a source of activating energy such as ultraviolet light to form a latent image in the coating. The photomask has areas both opaque and transparent to activating radiation that define a desired image to be transferred to the underlying substrate. A relief image is provided by development of the latent image pattern in the resist coating.

The use of photoresists is generally described, for example, by DeForest, *Photoresist Materials and Processes*, McGraw Hill Book Company, New York (1975), and by Moreau, *Semiconductor Lithography*, Principals, Practices and Materials, Plenum Press, New York (1988).

Recent developments in photoresist imaging involve formulation of photoresists imaged by exposure of coatings to deep ultraviolet (DUV) radiation. As is known by those in the art, DUV refers to exposure radiation having a wavelength in the range of 350 nm or less, more typically in the range of 300 nm or less and most often, 248 nm. Photoresists imaged by DUV exposure offer the advantage of providing patterns of reduced feature size compared to photoresists imaged by exposure to radiation of longer wavelength.

"Chemically amplified" photoresist compositions have been developed that are especially suitable for DUV imaging. Chemically amplified photoresists may be negative or positive-acting and rely on many crosslinking events (in the case of a negative-acting resist) or deprotection reactions (in the case of a positive-acting resist), each catalyzed by photogenerated acid or base. In the case of the positive chemically amplified resist, certain cationic photoinitiators capable of yielding a photogenerated acid have been used to induce cleavage of certain "blocking" groups pendant from a photoresist binder, or cleavage of certain groups that comprise a certain photoresist binder backbone. See, for example, U.S. Pat. Nos. 4,491,628; 4,810,613; 4,883,740; 4,968,581; 5,075,199; 5,258,257; 5,362,600; and 5,558,971. Upon exposure of a photoresist coating and a post exposure bake, selected cleavage of the blocking group results in formation of a polar functional group, e.g., hydroxyl, carboxyl or imide. The generation of a polar functional group provides differential solubility characteristics between exposed and unexposed areas of the resist coating.

The above patents illustrate a variety of blocking groups that may be utilized for positive working chemically amplified photoresists. Each blocking group requires a given quantity of energy to effect deblocking. The required energy is known in the art as the activation energy. A means to determine activation energy is described by Wallraff et al., *Kinetics of Chemically Amplified Resists*, Photopolymers Principles, Processes, and Materials, Tenth International Technical Conference, pp. 11–17, Oct. 31–Nov. 2, 1994, Society of Plastic Engineers, Inc. and by Wallraff et al., J. Vac. Sci Technol., 1995, 12 (6) 3857. Activation energy is expressed in units of Kcal/mol. Blocking groups having greater activation energy for deblocking require more severe conditions to effect deblocking. Means for overcoming greater activation energy include use of a stronger photogenerated acid and/or higher bake temperatures.

Many different blocking groups are disclosed in the above identified patents. For example, in U.S. Pat. No. 5,558,971, the blocking group is an acetal or ketal group of the formula "—$OCR^1R^2OR^3$" where $R^1$ and $R^2$ are independently a hydrogen atom, a straight-chain, branched or cyclic alkyl group having 1–6 carbon atoms, a straight-chain or branched haloalkyl group having 1–6 carbon atoms, or a phenyl group, provided that $R^1$ and $R^2$ are not hydrogen at the same time, or $R^1$ and $R^2$ may combine to form a methylene chain having 2–5 carbon atoms, and $R^3$ is a straight chain, branched or cyclic alkyl group having 1–10 carbon atoms, a straight-chain, branched or cyclic haloalkyl group having 1–6 carbon atoms, an acetyl group or an aralkyl group.

The acetal or ketal group as represented by the above formula is deblocked at a relatively low activation energy, typically from 10 to 20 Kcal/mol. To effect deblocking, a relatively weak photogenerated acid and/or a relatively low temperature post exposure bake or both may be used to effect the deblocking reaction. Though this is desirable for processing of the photoresist coating, a low activation energy formulation suffers certain disadvantages. For example, deblocking of the blocking group may randomly occur during storage of the photoresist in its container. A decreased number of blocking groups on the polymer backbone may result in an unpredictable change in resist photospeed upon imaging.

To avoid storage instability, certain vendors of chemically amplified resists have used blocking groups that require a greater activation energy. For example, in U.S. Pat. No. 5,362,600, the blocking group conforms to the formula —$CR^4R^5C(=O)OR^6$ where each of $R^4$ and $R^5$ is independently selected from the hydrogen, an electron withdrawing group such as halogen, lower alkyl having 1 to 10 carbon atoms, and substituted lower alkyl having 1 to 10 carbon atoms; and $R^6$ is a substituted or unsubstituted lower alkyl having from 1 to 10 carbon atoms, substituted or unsubstituted aryl having from 1 to 10 carbon atoms, and substituted or unsubstituted benzyl having 7 to 10 carbon atoms. The substitutents may be, for example, one or more of halogen, lower alkyl, lower alkoxy, aryl or benzyl. $R^4$ and $R^5$ desirably are each hydrogen. If $R^4$ and/or $R^5$ are halogen or other electron-withdrawing group, upon acidic cleavage of the acetate group, a highly polar group is formed providing enhanced solubility differential between exposed and unexposed regions of the photoresist coating. The difluoro group (i.e., $R^4$ and $R^5$ are both fluoro) is especially suitable and provides extremely high dissolution differential between exposed and unexposed regions with only modest levels of substitution of hydroxy groups on the polymer binder.

For the high energy blocking groups described above, an activation energy of at least 20 Kcal/mole is required and typically, the required activation energy is within the range of from 25 to 40 Kcal/mole. To enable deblocking to occur, it is necessary to use one or both of a photoacid generator capable of liberating a strong acid and/or a high temperature post exposure bake, typically a temperature in excess of 120° C. and preferably, a temperature of from 130° C. to 150° C. or higher.

For reasons set forth above, those photoresists using blocking groups requiring high activation energy are generally subjected to one and often two high temperature baking steps. In practice, it has been found that with high temperature baking, minor variations in the bake temperature, i.e., variations of ±1° C., across the width of the photoresist coating may lead to significant variation in linewidth across the developed coating and that this variation increases with increased bake temperature. This sensitivity is referred to in the art as PEB sensitivity which is defined as changes in linewidth at a fixed exposure dose on wafers that are post-exposure baked at increasing temperatures. The measured linewidth on each wafer is plotted against the PEB temperature and the PEB sensitivity in nm/° C. is the slope of the line. PEB sensitivity may be as much as 5% per degree Celsius. It is known that it is difficult to maintain a uniform temperature across the full width of the resist coating—i.e., across the full width of a wafer coated with photoresist which may be 8 or more inches in diameter.

Linewidth variation is unacceptable for most commercial applications. Therefore, it is desirable to have chemically amplified photoresist compositions capable of providing highly resolved fine line images, including images of submicron and sub half-micron dimension, which are PEB insensitive. It is particularly desirable to have such a chemically amplified photoresist where variation in linewidth as a function of post exposure bake temperature is reduced or eliminated.

SUMMARY OF THE INVENTION

The present invention provides a chemically amplified photoresist composition comprising a resin binder having acid labile blocking groups requiring an activation energy in excess of 20 Kcal/mole, a photoacid generator capable of generating a strong halogenated sulfonic acid upon photolysis, and optionally a base additive. Surprisingly, it has been found that PEB (post-exposure baked) sensitivity as a consequence of a high temperature bake is substantially reduced when using the halogenated sulfonic acid generator and further, the base additive also contributes to a reduction in the PEB sensitivity. Accordingly, the photoresists of the invention provide photoresist coating composition capable of forming highly resolved relief images of submicron dimension with vertical or essentially vertical sidewalls, uniformly imaged across the full width of a wafer over which the photoresist is coated, regardless of the temperature differential across the surface of the resist coating during the bake step.

A copolymer of the invention corresponds to the following formula:

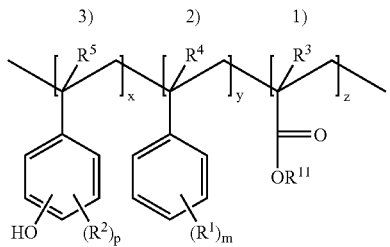

wherein $R^{11}$ of units 1) is substituted or unsubstituted alkyl having 1 to 10 carbon atoms. The polymer may comprise a mixture of different $R^{11}$ groups, e.g., by using a variety of acrylate monomers during the polymer synthesis.

$R^1$ groups of units 2) each independently may be halogen, substituted or unsubstituted alkyl, substituted or unsubstituted alkoxy, substituted or unsubstituted alkenyl, substituted or unsubstituted alkynyl, substituted or unsubstituted alkylthio, cyano, or nitro; and m is an integer of from 0 (where the phenyl ring is fully hydrogen-substituted) to 5. Also, two $R^1$ groups on adjacent carbons may be taken together to form (with ring carbons to which they are attached) one, two or more fused aromatic or alicyclic rings having from 4 to 8 ring members per ring. As with units 1), the polymer may comprise a mixture of different units 2) with differing $R^1$ groups or no $R^1$ groups (i.e. m=0) by using a variety of substituted or unsubstituted vinylphenyl monomers during the polymer synthesis.

$R^2$ groups of units 3) each independently may be halogen, substituted or unsubstituted alkyl, substituted or unsubstituted alkoxy, substituted or unsubstituted alkenyl, substituted or unsubstituted sulfonyl, substituted or unsubstituted alkyl esters; and p is an integer of from 0 (where the phenyl ring has a single hydroxy substitutent) to 4. Also, two $R^2$ groups on adjacent carbons may be taken together to form (with ring carbons to which they are attached) one, two or more fused aromatic or alicyclic rings having from 4 to 8 ring members per ring. As with units 1), the polymer may comprise a mixture of different units 3) with differing $R^2$ groups or no $R^2$ groups (i.e. p=0) by using a variety of substituted or unsubstituted vinylphenyl monomers during the polymer synthesis. As shown in the formula above, the hydroxyl group of units 3) may be either at the ortho, meta or para positions throughout the copolymer.

Each $R^3$, $R^4$ and $R^5$ substitutents independently may be hydrogen or substituted or unsubstituted alkyl.

In the above formula, x, y and z are mole fractions or percents of units 3), 2) and 1), respectively, in the copolymer. Variable x may be from 10 to 90 percent; y may be from 1 to 75 percent; and z may be 1 to 75 percent.

The photoacid generator used in the formulation of the invention is one that yields a strong halogenated sulfonic acid upon photolysis, preferably one having a $pK_a$ no greater than 0, and more preferably, a $pK_a$ of between −5.0 and −15.0. Preferred photoactive generators are sulfonate salts of compounds containing a strong halogen electron withdrawing group such as the fluorine atom. Suitable bases optionally used in combination with the acid generator are those preferably having a $pK_a$ of at least 9.0 and more preferably, a $pK_a$ between 11.0 and 15.0. Desirably, the strong base is a quaternary ammonium hydroxide.

One class of photoacid generators that may be used to practice the invention have a formula:

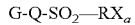

where R may be an alkyl having from 1 to 18 carbon atoms, X is a strong electron withdrawing group, subscript "a" is a whole number, Q is oxygen or a chemical bond, and G is a substituted or unsubstituted alkyl phenyl, a substituted phenyl, an imido, sulfone, sulfonium ion, or iodonium ion.

Another class of photoacid generators include a photoacid generator having a formula:

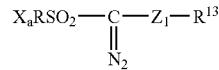

where X, R and subscript "a" are defined as above and $R^{13}$ is a straight chain, branched or cycle alkyl and $Z_1$ is a sulfonyl or carbonyl group.

The invention also provides methods for forming relief images using the photoresists of the invention and articles of manufacture comprising substrates such as a microelectronic wafer or a flat panel display substrate coated with the photoresists invention. Other aspects of the invention are disclosed herein.

DETAILED DESCRIPTION OF THE INVENTION

The photoresists of the invention comprise a resin binder, a photoacid generator that liberates a halogenated sulfonic acid upon photolysis and optionally, a base. The photoresist is used in a process comprising the steps of coating the same onto a substrate, imaging to DUV irradiation and post exposure baking (PEB) the resist coating at a temperature in excess of 120° C. and preferably in excess of 130° C.

The resin binder component of the photoresist desirably contains phenol units substituted with acid labile groups which may be pendant from the resin backbone. The resin is used in an amount sufficient to render an exposed coating of the resist developable such as with an aqueous alkaline solution. Exemplary phenolic resins containing acid labile groups are disclosed in the above mentioned patents such as U.S. Pat. No. 4,491,628 to Ito as well as in U.S. Pat. No. 5,258,257 to Sinta et al, and U.S. Pat. No. 5,492,793 to Ito.

Typical resin binders comprise polymers such as novolak resins and polyvinylphenol resins. A polymer suitable for purposes of the invention comprises units of a structure selected from the group consisting of

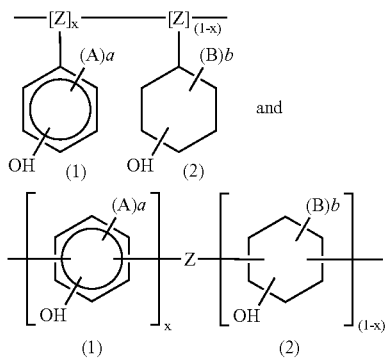

where unit (1) represents a phenolic unit and unit (2) represents a cyclic alcohol unit; Z is an alkylene bridge having from 1 to 3 carbon atoms; A is a substitutent on the aromatic ring replacing hydrogen such as lower alkyl having from 1 to 3 carbon atoms, halo such as fluoro, chloro or bromo, alkoxy having from 1 to 3 carbon atoms, hydroxyl, nitro, amino, etc.; B is a substitutent such as hydrogen, lower alkyl having from 1 to 3 carbon atoms, halo such as fluoro, chloro or bromo, alkoxy having from 1 to 3 carbon atoms, hydroxyl, nitro, amino, etc., provided that at least 3 of said B substitutents are hydrogen; subscript "a" is a number varying from 0 to 3; b is an integer varying from 6 and 10; and x is the mole fraction of units (1) in the polymer. The percentage of cyclic alcohol units preferably is not so high as to prevent development of an exposed film in a polar developer. The polymer therefore should have a major portion of phenolic units and a minor portion of cyclic alcohol units, i.e., less than 50 mole percent of cyclic alcohol units. However, it has been found that the transparency of the photoresist composition increases with increasing concentration of cyclic alcohol units and for this reason, in certain cases, it may be desirable to employ a polymer having a major portion of cyclic alcohol units and a minor portion of phenolic units. This can he achieved by using suitable blocking groups which upon acid catalyzed hydrolysis provide polar functional groups rendering exposed regions highly soluble in polar developer solutions.

An additional suitable class of resins comprises a copolymer of hydroxystyrene and an acrylate, methacrylate or a mixture of the two. The hydroxystyrene component provides base solubility to the resist composition. This component is suitably the para- or meta-isomer and can be substituted with various substitutents that do not interfere with lithography such as halogen, methoxy or lower alkyl, e.g. methyl or ethyl. α-Methyl-hydroxy-styrene monomer can also be incorporated into the polymer. The ester group of the acrylate or the methacrylate is an acid labile group which inhibits the dissolution of the polymer in alkaline developer and provides acid sensitivity to the polymer. Polymers of this description may be represented by the following structural formula:

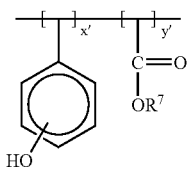

where x' represents the mole fraction of the hydroxystyrene units and y' represents the mole fraction of the acrylate units, the hydroxyl group on the hydroxystyrene may be present at either the ortho, meta or para positions throughout the copolymer, and $R^7$ is substituted or unsubstituted alkyl having 1 to 18 carbon atoms, more typically 1 to 8 carbon atoms. Tert-butyl is a generally preferred $R^7$ group. An $R^7$ group is desirably substituted by e.g. one or more halogen atoms (particularly F, Cl or Br), $C_{1-8}$ alkoxy, $C_{2-8}$ alkenyl, etc. The units x' and y' may be regularly alternating in the copolymer, or may be randomly interspersed through the polymer. Preferably, x' varies between 0.5 and 0.95 and y' varies between 0.05 and 0.5.

A particularly preferred copolymer of the invention corresponds to the following formula:

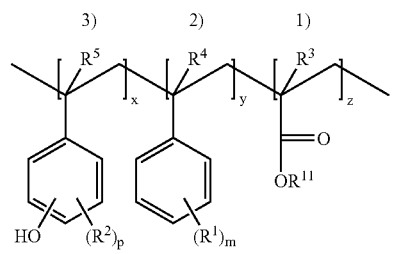

wherein $R^{11}$ of units 1) is substituted or unsubstituted alkyl. For example, $R^{11}$ may have 1 to 10 carbon atoms, preferably 1 to 8 carbons, and more preferably 1 to 6 carbon atoms.

Branched alkyls such as tert-butyl are the most preferred $R^{11}$ groups. Also, the polymer may comprise a mixture of different $R^{11}$ groups, e.g., by using a variety of acrylate monomers during the polymer synthesis.

$R^1$ groups of units 2) each independently may be e.g. halogen (particularly F, Cl and Br), substituted or unsubstituted alkyl preferably having 1 to 8 carbons, substituted or unsubstituted alkoxy preferably having 1 to 8 carbon atoms, substituted or unsubstituted alkenyl preferably having 2 to 8 carbon atoms, substituted or unsubstituted alkynyl preferably having 2 to 8 carbons, substituted or unsubstituted alkylthio preferably having 1 to 8 carbons, cyano, nitro, etc.; and m is an integer of from 0 (where the phenyl ring is fully hydrogen-substituted) to 5, and preferably is 0, 1 or 2. Also, two $R^1$ groups on adjacent carbons may be taken together to form (with ring carbons to which they are attached) one, two or more fused aromatic or alicyclic rings having from 4 to 8 ring members per ring. For example, two $R^1$ groups can be taken together to form (together with the depicted phenyl) a naphthyl or acenaphthyl ring. As with units 1), the polymer may comprise a mixture of different units 2) with differing $R^1$ groups or no $R^1$ groups (i.e. m=0) by using a variety of substituted or unsubstituted vinylphenyl monomers during the polymer synthesis.

$R^2$ groups of units 3) each independently may be e.g. halogen (particularly F, Cl and Br), substituted or unsubstituted alkyl preferably having 1 to 8 carbons, substituted or unsubstituted alkoxy preferably having 1 to 8 carbon atoms, substituted or unsubstituted alkenyl preferably having 2 to 8 carbon atoms, substituted or unsubstituted sulfonyl preferably having 1 to 8 carbon atoms such as mesyl ($CH_3SO_2O$—), substituted or unsubstituted alkyl esters such as those represented by $R^{12}COO$— where $R^{12}$ is preferably an alkyl group preferably having 1 to 10 carbon atoms, substituted or unsubstituted alkynyl preferably having 2 to 8 carbons, substituted or unsubstituted alkylthio preferably having 1 to 8 carbons, cyano, nitro, etc.; and p is an integer of from 0 (where the phenyl ring has a single hydroxy substitutent) to 4, and preferably is 0, 1 or 2. Also, two $R^2$ groups on adjacent carbons may be taken together to form (with ring carbons to which they are attached) one, two or more fused aromatic or alicyclic rings having from 4 to 8 ring members per ring. For example, two R groups can be taken together to form (together with the phenol depicted in the formula above) a naphthyl or acenaphthyl ring. As with units 1), the polymer may comprise a mixture of different units 3) with differing $R^2$ groups or no $R^2$ groups (i.e. p=0) by using a variety of substituted or unsubstituted vinylphenyl monomers during the polymer synthesis. As shown in the formula above, the hydroxyl group of units 3) may be either at the ortho, meta or para positions throughout the copolymer. Para or meta substitution is preferred.

Each $R^3$, $R^4$ and $R^5$ substitutent independently may be hydrogen or substituted or unsubstituted alkyl, for example, having 1 to 8 carbon atoms, preferably 1 to 6 carbons, or more preferably 1 to 3 carbons. Most preferably $R^3$, $R^4$ and $R^5$ are hydrogen.

The above-mentioned substituted groups (i.e. substituted groups $R^{11}$ and $R^1$ through $R^5$) may be substituted at one or more available positions by one or more groups such as halogen (particularly F, Cl or Br); $C_{1-8}$ alkyl; $C_{1-8}$ alkoxy; $C_{2-8}$ alkenyl; $C_{2-8}$ alkynyl; aryl such as phenyl; or alkanoyl such as a $C_{1-6}$ alkanoyl of acyl. Typically a substituted moiety is substituted at one, two or three available positions.

In the above formula, x, y and z are the mole fractions or percents of units 3), 2) and 1) respectively in the copolymer. These mole fractions vary over wide values. Variable x may be from 10 to 90 percent, more preferably 20 to 90 percent; y may be from 1 to 75 percent, more preferably 2 to 60 percent; and z may be 1 to 75 percent, more preferably 2 to 60 percent.

Preferred copolymers include those where the only polymer units correspond to the general structures of units 1), 2) and 3) above and the sum of the mole percents x, y and z equals one hundred. However, preferred polymers also may comprise additional units wherein the sum of x, y and z may be less than one hundred, although preferably those units 1), 2) and 3) still constitute a major portion of the copolymer, e.g. where the sum of x, y and z may be at least 50 percent (i.e. at least 50 molar percent of the polymer consists of units 1), 2) and 3)), more preferably the sum of x, y and z is at least 70 percent, and still more preferably the sum of x, y and z is at least 80 or 90 percent. Polymers conforming to the above formula are disclosed in U.S. Pat. No. 5,861,231.

Polymers of the present invention are included in the photoresists in amounts of 5% to 30% by weight of solids, preferably from 10% to 20% by weight of solids. The term "solids" means all of the non-volatile components that remain in the photoresist when dried. Non-volatile components may include polymer binders, PAGs, thickners, surfactants, neutralizing bases, dyes and other non-volatile additives.

The above described polymers can be readily formed. For example, for resins of the above formulas, vinyl phenols and a substituted or unsubstituted alkyl acrylate such as t-butylacrylate and the like may be condensed under free radical conditions as known in the art. The substituted ester moiety, i.e., $R^{11}$—O—C(=O)—, moiety of the acrylate units serves as the acid labile groups of the resin and will undergo photoacid induced cleavage upon exposure of a coating of a photoresist containing the resin to DUV irradiation. Preferably the copolymer will have a molecular weight of from 2,000 to 50,000, more preferably 5,000 to 30,000 with a molecular weight distribution of 3 or less, more preferably a molecular weight distribution of 2 or less. Desirably, the terpolymer contains the hydroxystyrene in the range of 50 to 90 mol % depending on the desired dissolution rate/sensitivity. The terpolymer has a high glass transition temperature of 130° C. to 170° C. The terpolymer also has a high acid sensitivity. The acid labile ester groups of the terpolymer are surprisingly thermally stable in the presence of the phenolic hydroxy groups up to a temperature of 180° C. This enables high temperature pre- and post exposure baking of a film of the composition which results in substantially improved lithographic performance. Additional details relating to the formation of such polymers can be found in U.S. Pat. No. 5,492,793 and in the above cited patent U.S. Pat. No. 5,861,231.

In addition to the resins described above, non-phenolic resins, e.g. a copolymer of an alkyl acrylate such as t-butylacrylate or t-butylmethacrylate and a vinyl alicyclic monomer such as a vinyl norbornyl or vinyl cyclohexanol compound may be prepared by such free radical polymerization or other known procedures and used as a binder in the photoresists described herein.

At least a portion of the available hydroxyl groups on any of the above described polymer binders are bonded to an acid labile blocking group. In accordance with the invention, suitable blocking groups are those that deblock at an activation energy of at least 20 Kcal/mole and which, upon photocleavage, provide a group that is at least as polar as hydroxyl.

Using vinylic polymers for purposes of illustration, the acid labile blocking groups are generally used in accordance with the following scheme in which a preferred polymer binder is condensed with a compound that comprises an acid labile group R' and a suitable leaving group (L).

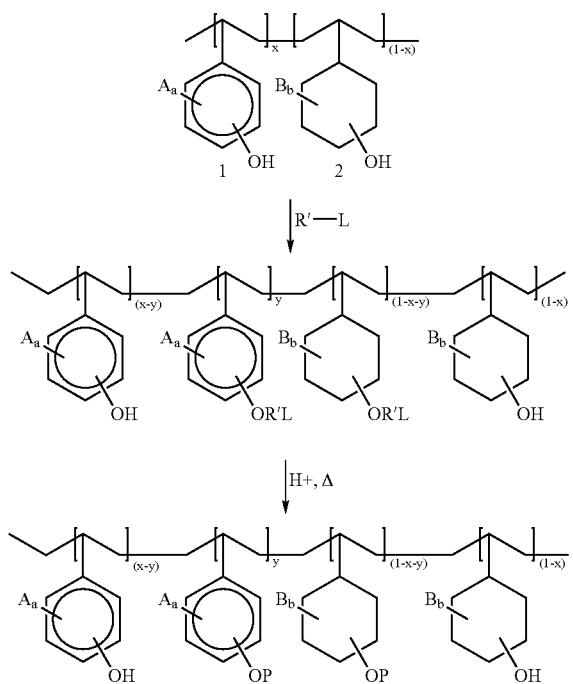

In the scheme shown described above, unit (1) represents a phenolic unit and unit (2) represents a cyclic alcohol unit: A, B, a, b and x are as defined above, R' is an acid labile blocking group; P is a polar group formed by acidic cleavage of the acid labile blocking group R'; and y is the mole fraction of units substituted with an acid labile group. The mole fraction represented by y may differ between aromatic units and cyclic alcohol units. Upon exposure, the photogenerated acid cleaves the acid labile group which is converted from a dissolution inhibiting group to a base soluble organic group thereby enabling image development of the composition.

Regardless of the resin used as the photoresist binder, it is substituted with an acid labile group that yields a suitable leaving group at an activation energy of 20 Kcal/mol or greater. For example, to provide acid labile acetic acid groups pendant to the resin binder backbone, the preformed resin binder may be condensed with a compound of the formula L-CR$^8$R$^9$C(=O)—OR$^{10}$, where L is a leaving group such as bromide or chloride as described above, R$^8$ and R$^9$ are each independently hydrogen, an electron withdrawing group such as halogen (particularly F, Cl or Br), or substituted or unsubstituted $C_{1-10}$ alkyl; and R$^{10}$ is substituted or unsubstituted $C_{1-10}$ alkyl, or substituted or unsubstituted aryl such as phenyl or aralkyl such as benzyl. The condensation provides the —CR$^8$R$^9$C(=O)—O—R$^{10}$ groups pendant to the resin binder backbone and grafted onto the resin's available hydroxyl groups. Photoacid degradation of these groups during exposure and/or post-exposure heating provides the polar acetic acid ether moiety pendant to the resin binder backbone. Other acid labile groups may also be employed, e.g. oxycarbonyl groups such as those of the formula —C(=O)OR$^6$ where R$^6$ is as defined above and preferably is t-butyl or benzyl. See U.S. Pat. No. 5,258,257 to Sinta et al. for a discussion of acid labile groups and preparation and use of resist resin binders comprising acid labile groups.

The photoresist compositions of the invention also contain a photoacid generator capable of generating a strong acid upon exposure to deep UV radiation. The photoacid generator is one that liberates a sulfonic acid having a strong electron withdrawing group. The function of the electron withdrawing group is to increase the strength of the photogenerated acid. The sulfonic acid has a pK$_a$ of 0 or less and preferably a pK$_a$ within a range of −5 to −15 or less. The photoacid generator is suitably employed in an amount sufficient to generate a latent image in a coating layer of the resist upon exposure to activating radiation.

In accordance with the invention, the photoacid generator is one capable of generating an acid of the formula:

X$_a$RSO$_3$H where X$_a$R is an organic radical substituted with strong electron withdrawing groups X. R may be alkyl having from 1 to 18 carbon atoms, aryl such as phenyl, benzyl, or naphthyl. Preferably R has 2 to 15 carbon atoms, more preferably from 5 to 10 carbon atoms. Strong electron withdrawing groups that may be substituted onto R are exemplified by halo, or nitro, cyano, preferably fluoro. The subscript "a" represents the number of strong electron withdrawing groups substituted onto R and is a whole number equal to 1 to 18, preferably from 2 to 15, most preferably from 5 to 10. Substituted within the scope of the present invention means that a hydrogen on a carbon is replaced by a substituent group. Preferred strong acids conforming to the above formula are perfluorooctane sulfonic acid and 2-trifluoromethylbenzene sulfonic acid. Representative examples of compounds capable of generating acids conforming to the above generalized formula are given below where nomenclature and substitutent identification used in the text is derived from an identified reference source and where, from time to time, the (X$_a$RSO$_3$)$^-$ radical is substituted onto the exemplified material.

One class of suitable photoacid generators is disclosed in U.S. Pat. No. 5,558,976. Representative examples of these photoacid generators include:

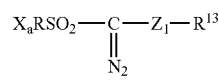

where R$^{13}$ is a straight-chain, branched or cyclic alkyl group having from 1 to 10 carbon atoms and Z$_1$ is a sulfonyl group or a carbonyl group.

Another class of photoacid generators that may be used to practice the invention has a formula:

G-Q-SO$_2$-RX$_a$ where R, X and subscript "a" are as defined above, Q is oxygen or a chemical bond, and G is a substituted or unsubstituted alkyl phenyl, a substituted phenyl, an imido, sulfone, sulfonium ion, or iodonium ion.

Substitutent groups include, but are not limited to, —OSO$_2$X$_a$R, where X$_a$ and R are defined as above, hydrogen, hydroxyl, acyl, aryl, branched or unbranched alkyl, branched or unbranched alkoxy, carboxy, halogen or nitro groups.

Examples of such photoacid generators include:

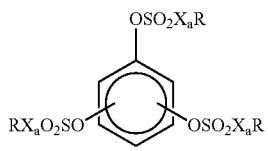

where R is as defined above; and

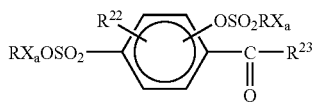

where $R^{22}$ is hydrogen, hydroxyl or a group represented by the formula $X_aRSO_2O$— where $X_aR$ is as defined above, and $R^{23}$ is a straight or branched alkyl group having from 1 to 5 carbon atoms or a group represented by the formula:

where $R^{24}$ and $R^{30}$ are independently a hydrogen atom, a halogen atom, a straight chain or branched alkyl group having 1–5 carbon atoms, a straight chain or branched alkoxy group having 1–5 carbon atoms, or a group of the formula:

$R^{26}SO_2O$— where $R^{26}$ is a group represented by the formula:

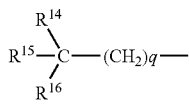

where $R^{14}$, $R^{15}$ and $R^{16}$ are independently a hydrogen atom or a halogen atom; and q is 0 or an integer of 1–3, or a group represented by the formula:

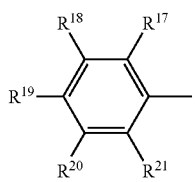

wherein $R^{17}$ $R^{18}$, $R^{19}$, $R^{20}$ and $R^{21}$ are independently a hydrogen atom or a halogen atom, a straight-chain or branched alkyl group having 1–5 carbon atoms, a straight-chain or branched alkoxy group having 1–5 carbon atoms, a trifluoromethyl group, a hydroxyl group, or trifluoromethoxy group.

Sulfonium salts represent the most preferred embodiment of the invention and are represented by the following formula:

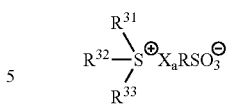

where $R^{30}$, $R^{32}$ and $R^{33}$ each independently represents a substituted or unsubstituted alkyl group or aryl group. With regard to each of the above formulae, preferred examples of the substituted or unsubstituted alkyl group and aryl group include a $C_{6-14}$ aryl group, a $C_{1-5}$ alkyl group, and substituted derivatives thereof. Preferred examples of the substitutent on the alkyl group include a $C_{1-8}$ alkoxy group, a $C_{1-8}$ alkyl group, nitro group, carboxyl group, hydroxyl group, and a halogen atom. Preferred examples of the substitutent on the aryl group include a $C_{1-8}$ alkoxy group, carboxyl group, an alkoxycarbonyl group, a $C_{1-8}$ haloalkyl group, a $C_{5-8}$ cycloalkyl group and a $C_{1-8}$ alkylthio group.

Another suitable sulfonium salt has a formula:

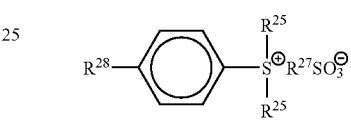

where $R^{25}$ is a straight chain or branched alkyl group having 1–4 carbon atoms, a phenyl group, a substituted phenyl group or an aralkyl group; $R^{28}$ is a hydrogen atom, a halogen atom or a straight-chain, branched or cyclic alkyl group having 1–6 carbon atoms; $R^{27}$, is a straight chain or branched perfluoroalkyl group having 1–8 carbon atoms, preferably 2 to 8 carbons, a straight chain, branched or cyclic alkyl group having 1–8 carbon atoms, preferably 2 to 8 carbons, a 1-naphthyl group, a 2-naphthyl group, a 10-camphor group, a phenyl group, a tolyl group, a 2,5-dichlorophenyl group, a 1,3,4-trichlorophenyl group or a trifluoromethylphenyl group.

Nitrobenzyl based compounds are disclosed in EPO published application No. EP 0 717 319 A1. Such compounds may be defined by the following general formula:

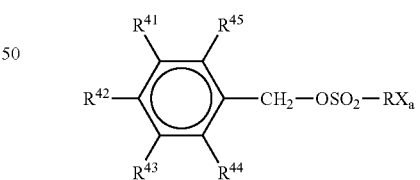

where each $R_{41}$, $R_{42}$ and $R_{43}$ are individually selected from the group consisting of hydrogen and lower alkyl group having from 1–4 carbon atoms; and $R_{44}$ and $R_{45}$ are individually selected from the group consisting of $CF_3$ and $NO_2$ with the proviso that $R_{44}$ and $R_{45}$ cannot both be $CF_3$; and $RX_a$ is as defined above.

N-sulfonyloxyimide PAGs may also be used in the compositions of the invention and are as disclosed in World application WO94/10608. These materials conform to the formula:

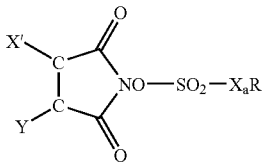

where the carbon atoms form a two carbon structure having a single, double or aromatic bond, or, alternatively, wherein they form a three carbon structure, that is, where the imide ring is a five member or six member ring; X' and Y (1) form a cyclic or polycyclic ring which may contain one or more hetero atoms, or (2) form a fused aromatic ring, or (3) may be independently hydrogen, alkyl or aryl, or (4) may be attached to another sulfonyloxyimide containing residue, or (5) may be attached to a polymer chain or backbone, or alternatively, form

where $R_1$ is selected from the group consisting of H, acetyl, acetamido, alkyl having 1 to 4 carbons where m=1 to 3, $NO_2$ where m=1 to 2, F where m=1 to 5, Cl where m=1 to 2, $CF_3$ where m=1 to 2, and OCH3 where m=1 to 2, and where m may otherwise be from 1 to 5, and combinations thereof, and where X and Y (1) form a cyclic or polycyclic ring which may contain one or more hetero atoms, (2) form a fused aromatic ring, (3) may be independently H, alkyl or aryl, (4) may be attached to another sulfonyloxyimide containing residue, or (5) may be attached to a polymeric chain or backbone.

Iodonium salt photoacid generators are disclosed in published European application 0 708 368 A1 and represent another preferred acid generator. Such salts are represented by the following formula:

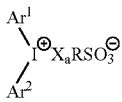

where $Ar^1$ and $Ar^2$ each independently represents a substituted or unsubstituted aryl group. A preferred example of the aryl group includes a $C_{6-14}$ monocyclic or a condensed ring aryl group. Preferred examples of the substitutent on the aryl group include an alkyl group, a haloalkyl group, a cycloalkyl group, an aryl group, an alkoxy group, a nitro group, a carboxyl group, an alkoxycarbonyl group, a hydroxyl group, mercapto group, and a halogen atom. Two of $R^{31}$, $R^{32}$ and $R^{33}$ and $Ar^1$ and $Ar^2$ may be connected to each other via a single bond or a substitutent.

Disulfone derivatives are also suitable for the formulations of this invention and are disclosed in published European application 0 708 368 A1. Such materials may be represented by the following formulae:

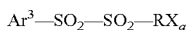

wherein $RX_a$ is as defined above and $Ar^3$ represents a substituted or unsubstituted aryl group. A preferred example of the aryl group includes a $C_{6-14}$ monocyclic or condensed-ring aryl group. Preferred examples of the substitutent on the aryl group include an alkyl group, a haloalkyl group, a cycloalkyl group, an aryl group, an alkoxy group, nitro group, carboxyl group, an alkoxycarbonyl group, hydroxyl group, mercapto group, and halogen.

Of the photoacid generators contemplated for use in the photoresists of the invention, most preferred are di-(4-t-butylphenyl) iodonium perfluorooctane sulfonate and di-(4-t-butylphenyl) iodonium 2-trifluoromethyl benzene sulfonate.

The photoresist compositions of the invention preferably contain a strong base having a $pK_a$ of at least 9 and preferably a $pK_a$ within the range of from 11 to 15. A preferred base for the photoresist of the invention would conform to the formula—$N(R')_4A$ where each R' is independently substituted or unsubstituted alkyl preferably having from 1 to about 12 carbon atoms, more typically 1 to 8 carbon atoms, or a substituted or unsubstituted aryl such as a $C_{6-10}$ aryl, e.g. phenyl, naphthyl and the like, A is a counter anion of a halide, a substituted or unsubstituted hydroxyalkanoyl preferably having 1 to 18 carbon atoms (i.e. a group substituted by hydroxy and carbonyl such as lactate—$CH_3CH(OH)C(=O)O^-$), substituted or unsubstituted sulfonate including a $C_{6-18}$ aryl or $C_{1-12}$ alkyl sulfonate. The term hydroxyalkanoyl as used herein refers to an alkanoyl group having one or more hydroxy moieties (typically 1, 2, 3 or 4 hydroxy moieties) on one or more carbons of the alkanoyl group. Exemplary sulfonate A groups include mesylate, triflate, tosylate, etc. Substituted A groups may be suitably substituted by one or more groups such as halo particularly fluoro, chloro and bromo, hydroxide, cyano, nitro, $C_{1-12}$ alkyl, $C_{2-12}$ alkyl, $C_{2-12}$ alkenyl, $C_{1-12}$ alkoxy, $C_{1-12}$ alkanoyl including acyl, etc. Additional amines can be found in U.S. Pat. No. 5,498,506 and SPIE, 2438, 551, 1995 and SPIE 2438, 563, 1995. Examples of suitable amines include ammonium sulfonate salts such as piperidinium p-toluenesulfonate and dicylohexylammonium p-tolunesulfonate; alkyl amines such as tripropylamine and dodecylamine; aryl amines such as diphenylamine, triphenylamine, aminophenol, or 2-(4-aminophenyl)-2-(4-hyroxyphenyl) propane.

The base can be added to the photoresist composition in a relatively small amount, for example, from 0.01 to 5 percent by weight of the polymer and more preferably, from 0.05 to 1 percent by weight.

An optional component of the photoresist composition of the invention is a dye. Preferred dyes enhance resolution of the patterned resist image, typically by reducing reflections and the effects thereof (e.g. notching) caused by the exposure radiation. Preferred dyes include substituted and unsubstituted phenothiazine, phenoxazine, anthracene and anthrarobin compounds. Preferred substitutents of substituted phenothiazine, phenoxazine, anthracene and anthrarobin include e.g. halogen, $C_{1-12}$ alkyl, $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g., an anthracene acrylate polymer or copolymer. A curcumin dye also may be used for some applications. In addition to reducing reflections in deep U.V. exposures, use of a dye may expand the spectral response of the compositions of invention.

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, a glycol ether exemplified by 2-methoxyethyl ether (diglyme), ethylene glycol monomethyl ether, propylene glycol monomethyl ether; a Cellosolve ester such as Cellosolve acetate, propylene glycolmonomethyl ether, methyl ethyl ketone, ethyl lactate, etc. Typically, the solids content of the composition varies between 5 and 35 percent by weight of the total weight of the photoresist composition. The resin binder and PAG components preferably are present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as a semiconductor by spinning, dipping, roller coating, slot coating or other conventional coating technique. When spin coating, the solids content of the coating solution may be adjusted to provide a desired film thickness based upon the specific spinning equipment utilized, the viscosity of the solution, the speed of the spinner and the amount of time allowed for spinning.

The resist compositions of the invention are applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system—i.e., generate sufficient acid to produce a patterned image in the resist coating layer following post exposure bake, and more specifically, the exposure energy typically ranges from 1 to 300 mJ/cm$^2$, dependent upon the exposure tool and the components of the photoresist composition.

Coating layers of the resist composition of the invention are preferably photoactivated by an exposure wavelength in the deep U.V. range i.e., 350 nm or less, more typically in the range of 300 nm or less, typically 150 to 300 or 350 nm. A particularly preferred exposure wavelength is 248 nm.

Following exposure, the film layer of the composition is preferably baked at temperatures ranging from 120° C. to 160° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a plasma gas etch (e.g. an oxygen plasma etch) and a hydrofluoric acid etching solution. The compositions of the invention are highly resistant to such etchants thereby enabling manufacture of highly resolved features, including lines with submicron widths. After such processing, resist may be removed from the processed substrate using known stripping procedures.

The following examples are intended to illustrate the present invention, not to limit its scope.

SYNTHESIS EXAMPLES

Example 1

Preparation of Di-(4-t-butylphenyl)iodonium 2-trifluoromethylbenzenesulfonate

Part A: Preparation of 2-Trifluoromethybenzenesulfonic acid

A 1L 3 neck flask was charged with 2-trifluoromethybenzenesulfonyl chloride (134.55g, 0.55 mol) and water (320 mL). The reaction flask was fitted with a condenser, an overhead stirrer and a nitrogen bubbler and the biphasic reaction mixture heated at reflux for 24 hours. During this time, the sulfonyl chloride hydrolyzed to 2-trifluoromethylbenzenesulfonic acid, giving a clear homogeneous solution. The aqueous solution was concentrated under vacuum and the solid residue further dried in vacuum at 40° C. for 24 hours to give 2-Trifluoromethylbenzenesulfonic acid as an off white solid.

Part B: Preparation of Di-(4-t-butylphenyl)iodonium 2-trifluoromethylbenzenesulfonate A 1L 3 neck round bottom flask equipped was charged t-butylbenzene (134.22 g, 1.00 mol) and acetic anhydride (204.18 g, 2.00 mol). The flask was fitted with an efficient overhead paddle stirrer and the stirrer started while potassium iodate (107.00 g, 0.50 mol) was added to give a white suspension. The reaction vessel was then equipped with a thermometer and a pressure equalizing dropping funnel (125 mL) fitted with a N$_2$ bubbler.

The reaction mixture was cooled to 0–5° C. in a large ice-water bath and concentrated sulfuric acid (107.89 g, 1.10 mol) added dropwise via the addition funnel. The addition was carried out at such a rate as to maintain the reaction temperature in the 20–30° C. range and required around 2 hours. As the addition proceeded the starting white suspension became orange-yellow in color and the viscosity of the reaction mixture increased giving a tan paste. Once the addition was over, the reaction mixture was stirred at water bath temperature (20° C.) for a further 22 hours. The reaction mixture was cooled to 5–10° C. and water (350 mL) was added dropwise over @ 30 min, maintaining the temperature below 30° C. The first @ 50 mL was added at a particularly slow rate to control the initial exotherm, thereafter the rest of the water was essentially added in one portion.

The resulting cloudy mixture was washed with hexane (3×75 mL) and the aqueous solution of diaryliodonium salt was returned to the reaction flask and cooled to 15–20° C. in an ice water bath. 2-Trifluoromethylbenzenesulfonic acid (113.09 g, 0.50 mol) (prepared as in Part A above) was added in one portion with stirring. The resulting cloudy reaction mixture was neutralized with ammonium hydroxide (14.8N, 311 mL, 4.60 mol). The amount of base used corresponds to the theoretical amount required to neutralize all acidic species in the pot, assuming quantitative reaction. The addition of the base was carried out at such a rate as to keep the temperature below 30° C. and required about 2 hours. As the pH of the reaction mixture approached 6–7, a brown gummy solid starts to precipitate from solution. At this point, addition of ammonium hydroxide is temporarily stopped and dichloromethane (300 mL) is added to give a biphasic mixture. After stirring for 3 hours, the dichloromethane layer was drained off and the aqueous layer extracted with additional dichloromethane (2×100 mL).

The combined dichloromethane extracts was washed with dilute ammonium hydroxide until the pH of the aqueous layer is in the 7–8 range [1×100 mL, the pH of the aqueous solution was adjusted to 8–9 by adding sufficient ammonium hydroxide (14.8N) in small portions]. The organic layer was washed with water (2×100 mL) until the pH of the aqueous phase was around 6–7. The dichloromethane solution was concentrated on a rotary evaporator under water aspirator vacuum. The resulting residue is then purified by successive recrystallizations from ethyl acetate-cyclohexane. The resulting white solid was dried at 70° C. in vacuum for 36 hours, to give di-(4-t-butylphenyl)iodonium 2-trifluoromethylbenzenesulfonate as a white powder.

Example 2

Preparation of Di-(4-t-butylphenyl)iodonium Perfluorooctanesulfonate

A 1L 3 neck round bottom flask equipped was charged t-butylbenzene (134.22 g, 1.00 mol) and acetic anhydride (204.18 g, 2.00 mol). The flask was fitted with an efficient overhead paddle stirrer and the stirrer started while potassium iodate (107.00 g, 0.50 mol) was added to give a white suspension. The reaction vessel was then equipped with a thermometer and a pressure equalizing dropping funnel (125 mL) fitted with a $N_2$ bubbler. The reaction mixture was cooled to 0–5° C. in a large ice-water bath and concentrated sulfuric acid (107.89 g, 1.10 mol) added dropwise via the addition funnel.

The addition was carried out at such a rate as to maintain the reaction temperature in the 20–30° C. range and required around 2 hours. As the addition proceeded the starting white suspension became orange-yellow in color and the viscosity of the reaction mixture increased giving a tan paste. Once the addition was over, the reaction mixture was stirred at water bath temperature (20° C.) for a further 22 hours. The reaction mixture was cooled to 5–10° C. and water (350 mL) was added dropwise over @ 30 min, maintaining the temperature below 30° C. The first @ 300 mL was added at a particularly slow rate to control the initial exotherm, thereafter the rest of the water was essentially added in one portion.

The resulting cloudy mixture was washed with hexane (3×75 mL) and the aqueous solution of diaryliodonium salt was returned to the reaction flask and cooled to 15–20° C. in an ice water bath. Perfluorooctanesulfonic acid, potassium salt (269.11 g, 0.50 mol) was added in one portion with stirring. The resulting cloudy reaction mixture was neutralized with ammonium hydroxide (14.8N, 277 mL, 4.10 mol). The amount of base used corresponds to the theoretical amount required to neutralize all acidic species in the pot, assuming quantitative reaction. The addition of the base was carried out at such a rate as to keep the temperature below 30° C. and required about 2 hours. As the pH of the reaction mixture approached 6–7, a brown gummy solid starts to precipitate from solution. At this point, addition of ammonium hydroxide is temporarily stopped and dichloromethane (300 mL) is added to give a biphasic mixture. After stirring for 3 hours, the dichloromethane layer was drained off and the aqueous layer extracted with additional dichloromethane (2×100 mL).

The combined dichloromethane extracts was washed with dilute ammonium hydroxide until the pH of the aqueous layer is in the 7–8 range (1×100 mL, the pH of the aqueous solution was adjusted to 8–9 by adding sufficient ammonium hydroxide (14.8N) in small portions). The organic layer was washed with water (2×100 mL) until the pH of the aqueous phase was round 6–7. The dichloromethane solution was concentrated on a rotary evaporator under water aspirator vacuum. The resulting residue is then purified by successive recrystallizations from ethyl acetate-cyclohexane. The resulting white solid was dried at 70° C. in vacuum for 36 hours, to give di-(4-t-butylphenyl)iodonium perfluorooctanesulfonate as a white powder.

Example 3

Preparation of Triphenylsulfonium perfluorooctanesulfonate

To a suspension of perfluorooctanesulfonic acid potassium salt (10.76 g, 20.0 mmol) in water (100 mL) at room temperature under nitrogen was added dropwise triphenylsulfonium bromide (6.87 g, 20.0 mmol) over 15 min. After stirring the suspension for 30 min., dichloromethane (100 mL) was added and the biphasic mixture stirred at room temperature for 20 hours. Additional dichloromethane (100 mL) was added and the layers separated. The organic layer was washed with water (3×75 mL) until the washings were neutral (pH 7). After drying ($MgSO_4$), removal of the solvent in vacuum gave a viscous gum which was further dried by heating at 50° C. for 24 hours under vacuum. In this way, triphenylsulfonium perfluorooctanesulfonate was isolated as a pale yellow gummy solid.

Example 4

Preparation of Triarylsulfonium perfluorooctanesulfonate

To a suspension of perfluorooctanesulfonic acid potassium salt (24.81 g, 46.1 mmol) in water (150 mL) at room temperature under nitrogen was added dropwise triarylsulfonium chloride (50% aqueous solution, 27.50 g) over 15 min. After stirring the suspension for 30 min., dichloromethane (75 mL) was added and the mixture stirred at room temperature for 20 hours. Additional dichloromethane (225 mL) was added and the layers separated. The organic layer was washed with water (3×125 mL) until the washings were neutral (pH 7). After drying ($MgSO_4$), removal of the solvent in vacuum gave a viscous gum which was further dried by heating at 80–90° C. for 84 h under vacuum. In this way, triarylsulfonium perfluorooctanesulfonate was isolated as a glassy solid.

Example 5

Preparation of N-[(perfluorooctanesulfonyl)oxy]-norborane-2,3-dicarboximide

A 500 mL 3 neck flask was charged with N-hydroxy-5-norbornene-2,3-dicarboximide (22.39 g, 0.125 mol). The flask was fitted with a condenser, a dropping funnel, a nitrogen bubbler and a magnetic stirrer.

1,1,1,3,3,3-Hexamethyldisilazane (14.50 mL, 11.10 g, 68.75 mmol) was added via the dropping funnel followed by one drop of chlorotrimethylsilane as catalyst. The suspension was brought to a gentle reflux and heated there at for 3 hours. The resulting solution solidified upon cooling to room temperature. This solid was presumed to be the corresponding N-OTMS ether. 1,2-Dimethoxyethane (75 mL) was added followed by perfluorooctanesulfonyl fluoride (37.85 mL, 69.04 g, 0.1375 mol) and the resulting biphasic mixture heated to reflux. A solution of triethylamine (3.48 mL, 2.53 g, 25.0 mmol) in 1,2-dimethoxyethane (25 mL) was added to the hot solution and the mixture turned pale orange. The reaction mixture was heated at reflux for 64 hours to give a dark brown-black solution.

At this stage, TLC showed the presence of the desired product and confirmed complete consumption of the starting alcohol. The reaction mixture was transferred to a 500 mL single neck flask and concentrated in vacuum to give a tan semi-solid which solidified on cooling to room temperature. The crude product (82.10 g) was suspended in hot methanol (200 mL) and heated to dissolve the solid. The resulting solution was cooled to room temperature and on standing for 6 hours, a significant amount of crystals were deposited.

The crystals were collected by suction filtration, rinsed with ice cold methanol (2×25 mL) and dried in vacuum at room temperature for 18 hours to give 28.03 g of material. The mother liquor was reduced to half its original volume and cooled in an ice bath to deposit additional solid. The second crystal crop was isolated as described above to give an additional 6.81 g of material. The two crystal crops were combined and purified by dry flash column chromatography using Flash grade silica gel using 50% dichloromethane/50% hexane as eluant. The material was further purified by recrystallization from hexanes. After drying at 50° C. for 24 h, N-[(perfluorooctanesulfonyl)oxy]-5-norbornene-2,3-dicarboximide was isolated as a white crystalline solid.

FORMULATION EXAMPLES

Example 1

A control resist formulation comprising a terpolymer of 4-hydroxystyrene, styrene and t-butylacrylate (72.35 g of a 20 wt. % solution in ethyl lactate), di-(4-t-butylphenyl) iodonium camphorsulfonate (DTBIOCS) 7.23 g of a 10 wt. % solution in ethyl lactate), a basic additive (20.89 g of 20 wt. % solution in propylene glycol monomethyl ether acetate), copolymer of 9-anthracene methacrylate and 2-hydroxyethyl methacrylate (0.23 g), Silwet™ L-7604 (1.60 g of a 5 wt. % solution in ethyl lactate) and ethyl lactate (15.69 g) was prepared.

Examples 2 to 5

Formulation examples 2 to 8 were prepared in a similar fashion to that described above incorporating the formulation indicated in Table II.

Resist Processing Examples

Table 1 tails the process conditions for the experiment using the resist formulation of the Formulation 1 Example. The wafers were processed on a GCA Microtrak coater and developer equipped for contact bakes. Exposures were performed on a GCAXLS7800 0.53NA, 0.74σ DUV Stepper.

TABLE I

Process Information for Formulation DOE

| Process Variable | Setting |
| --- | --- |
| Thickness | 6570 Å ($E_{min}$) |
| Softbake | 135° C., 60 sec. |
| PEB | 125–145° C. in 5° C. steps |
| Developer | MF-501 (0.24N surf) |
| Develop Process | 45 sec. Single stream puddle, 16 psi, Puddle Build 4 sec @ 500 rpm + 2 sec @ 50 rpm |

Results

Table II summarizes the PEB sensitivity results over the 130–140° C. for dyed resist formulations. PEB sensitivity is defined as the difference is line width between the smallest and widest lines across the resist surface.

TABLE II

PEB Sensitivity Results over 130–140° C. PEB Range

| Example | Formulation | PEB Sensitivity (nm/° C.) |
| --- | --- | --- |
| 1 | Control (5% DTBPIOCS, 4% Polyethyoxylated ethylene diamine | 14.7 |
| 2 | 5% DTBPIOCS 0.4% DTBPI Lactate | 11.9 |
| 3 | 5% DTBPOTFMBS, 0.4% TBAH | 4.0 |
| 4 | 5% DTBPIOPFOS, 0.4% TBAH | 4.0 |
| 5 | 5% TPSCSA, 0.4% TBAH | 9.3 |

The invention should not be construed as limited to the above recited examples.

What is claims is:

1. A positive working photoresist composition comprising an alkali soluble resin substituted with a acid labile blocking group that requires an activation energy of at least 20 Kcal/mol for deblocking, and a photoacid generating compound that undergoes photolysis when exposed to a pattern of activating radiation at a wavelength of 350 nm or less to yield a sulfonic acid having a strong electron withdrawing group and a $pK_a$ that does not exceed 0, the photoacid generator has a formula:

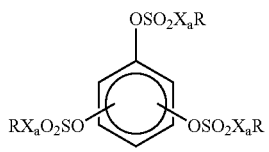

where R is an alkyl having from 1 to 18 carbon atoms or aryl, X is a strong electron withdrawing group and a is a whole number from 1 to 18; the alkali soluble resin has a formula:

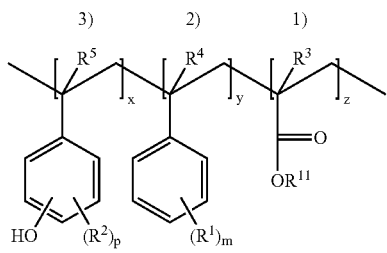

where x is from about 10 to 90 percent, y is from about 1 to 75 percent, and z is from 1 to 75 percent of the mole fraction, the hydroxyl group on the hydroxystyrene may be present at either the ortho, meta, or para positions throughout the copolymer, $R^{11}$ is substituted or unsubstituted alkyl having 1 to 10 carbon atoms, $R^1$ and $R^2$ are independently halogen, substituted or unsubstituted alkyl having from 1 to 8 carbon atoms, substituted or unsubstituted alkoxy having from 1 to 8 carbon atoms, substituted or unsubstituted alkenyl having 2 to 8 carbons atoms, substituted or unsubstituted alkylthio having from 1 to 8 carbon atoms, cyano, and nitro; and m is an integer of 0 to 5 and p is an integer of 0 to 4; and $R^3$, $R^4$, and $R^5$ are hydrogen or substituted or unsubstituted alkyl.

2. A positive working photoresist composition comprising an alkali soluble resin substituted with an acid labile blocking group that requires an activation energy of at least 20 Kcal/mol for deblocking, and a photoacid generating compound that undergoes photolysis when exposed to a pattern of activating radiation at a wavelength of 350 nm or less to yield a sulfonic acid having a strong electron withdrawing group and a $pK_a$ that does not exceed 0, the photoacid generator has a formula:

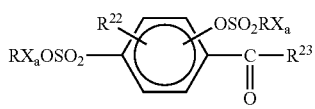

where R is an alky having 1 to 18 carbon atoms or aryl, X is a strong electron withdrawing group, a is a whole number from 1 to 18, $R^{22}$ is hydrogen, hydroxyl or $X_aRSO_2O$—, and $R^{23}$ is a straight or branched alkyl group having from 1 to 5 carbon atoms or a group represented by the formula:

where $R^{24}$ and $R^{30}$ are independently a hydrogen, halogen, a straight chain or branched alkyl group having 1 to 5 carbon atoms, a straight chain or branched alkoxy group having 1 to 5 carbon atoms, or a group of the formula:

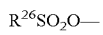

$R^{26}SO_2O$— where $R^{26}$ is a group represented by the formula:

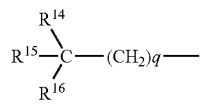

where $R^{14}$, $R^{15}$ and $R^{16}$ are independently a hydrogen or a halogen, and q is 0 of an integer of 1 to 3, or a group represented by the formula:

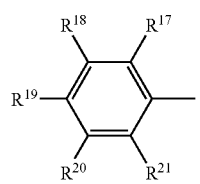

wherein $R^{17}$, $R^{18}$, $R^{19}$, $R^{20}$ and $R^{21}$ are independently a hydrogen, halogen, a straight-chain or branched alkyl group having 1 to 5 carbon atoms, a straight-chain or branched alkoxy group having 1 to 5 carbon atoms, a trifluoromethyl group, a hydroxyl group, or trifluoromethoxy group; the alkali soluble resin has a formula:

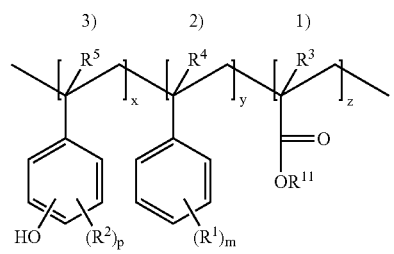

where x is from about 10 to 90 percent, y is from about 1 to 75 percent, and z is from 1 to 75 percent of the mole fraction, the hydroxyl group on the hydroxystyrene may be present at either the Ortho, meta, or para positions throughout the copolymer, $R^{11}$ is substituted or unsubstituted alkyl having 1 to 10 carbon atoms, $R^1$ and $R^2$ are independently halogen, substituted or unsubstituted alkyl having from 1 to 8 carbon atoms, substituted or unsubstituted alkoxy having from 1 to 8 carbons, substituted or unsubstituted alkenyl having 2 to 8 carbon atoms, substituted or unsubstituted alkylthio having from 1 to 8 carbon atoms, cyano, and nitro; and m is an integer of 0 to 5 and p is an integer of 0 to 4; and $R^3$, $R^4$, and $R^5$ are hydrogen or substituted or unsubstituted alkyl.

3. A positive working photoresist composition comprising an alkali soluble resin substituted with an acid labile block ing group that requires an activation energy of at least 20 Kcal/mol for deblocking, and a photoacid generating compound that undergoes photolysis when exposed to a pattern of activating radiation at a wavelength of 350 nm or less to yield a sulfonic acid having a strong electron withdrawing group and a $pK_a$ that does not exceed 0, the photoacid generator has a formula:

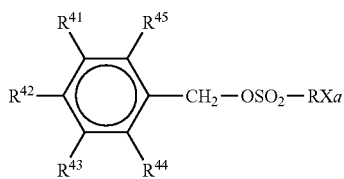

where R is an alkyl having from 1 to 18 carbon atoms or aryl, a is a whole number of 1 to 18, $R^{41}$, $R^{42}$ and $R^{43}$ are each individually selected from the group consisting of hydrogen and a ($C_1$ to $C_4$) alkyl; and $R^{44}$ and $R^{45}$ are independently selected from the group consisting of $CF_3$ and $NO_2$ with the proviso that $R^{44}$ and $R^{45}$ are not simultaneously $CF_3$; the alkali soluble resin has a formula:

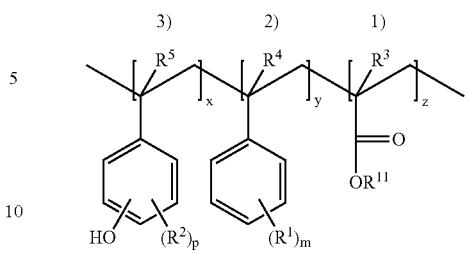

where x is from about 10 to 90 percent, y is from about 1 to 75 percent, and z is from 1 to 75 percent of the mole fraction, the hydroxyl group on the hydroxystyrene may be present at either the ortho, meta, or para positions throughout the copolymer, $R^{11}$ is substituted or unsubstituted alkyl having 1 to 10 carbon atoms, $R^1$ and $R^2$ are independently halogen, substituted or unsubstituted alkyl having from 1 to 8 carbon atoms, substituted or unsubstituted alkoxy having from 1 to 8 carbon atoms, substituted or unsubstituted alkenyl having 2 to 8 carbon atoms, substituted or unsubstituted alkylthio having from 1 to 8 carbon atoms, cyano, and nitro; and m is an integer of 0 to 5 and p is an integer of 0 to 4; and $R^3$, $R^4$, and $R^5$ are hydrogen or substituted or unsubstituted alkyl.

* * * * *